US012469787B2

(12) United States Patent
Farooq et al.

(10) Patent No.: US 12,469,787 B2
(45) Date of Patent: Nov. 11, 2025

(54) RESIST PATTERNED REDISTRIBUTION WIRING ON COPPER POLYIMIDE VIA LAYER

(71) Applicant: International Business Machines Corporation, Armonk, NY (US)

(72) Inventors: Mukta Ghate Farooq, Hopwell Junction, NY (US); James J. Kelly, Schenectady, NY (US); Eric Perfecto, Poughkeepsie, NY (US); Spyridon Skordas, Troy, NY (US); Dale Curtis McHerron, Staatsburg, NY (US)

(73) Assignee: International Business Machines Corporation, Armonk, NY (US)

( * ) Notice: Subject to any disclaimer, the term of this patent is extended or adjusted under 35 U.S.C. 154(b) by 752 days.

(21) Appl. No.: 17/651,883

(22) Filed: Feb. 21, 2022

(65) Prior Publication Data

US 2023/0268275 A1  Aug. 24, 2023

(51) Int. Cl.
*H01L 23/532* (2006.01)
*H01L 21/02* (2006.01)
*H01L 23/00* (2006.01)

(52) U.S. Cl.
CPC .... *H01L 23/5329* (2013.01); *H01L 21/02118* (2013.01); *H01L 24/05* (2013.01); *H01L 2224/024* (2013.01); *H01L 2924/01029* (2013.01)

(58) Field of Classification Search
CPC ........... H01L 23/5329; H01L 21/02118; H01L 24/05; H01L 2224/024; H01L 2924/01029
See application file for complete search history.

(56) References Cited

U.S. PATENT DOCUMENTS

| 5,266,446 | A | 11/1993 | Chang et al. |
| 8,558,383 | B2 | 10/2013 | Lin et al. |
| 9,576,919 | B2 | 2/2017 | Scanlan et al. |
| 10,037,981 | B2 | 7/2018 | Banna et al. |
| 10,373,885 | B2 | 8/2019 | Yu et al. |
| 11,018,120 | B2 | 5/2021 | Huang et al. |
| 2015/0026975 | A1 | 1/2015 | Kariya et al. |
| 2015/0364425 | A1 | 12/2015 | Lee et al. |
| 2020/0105634 | A1 | 4/2020 | Huang et al. |
| 2020/0126923 | A1 | 4/2020 | Hu et al. |
| 2023/0307251 | A1* | 9/2023 | Liu ........................ H01L 24/19 |

FOREIGN PATENT DOCUMENTS

| EP | 0690494 B1 | 3/2004 |
| TW | 1553824 B | 10/2016 |

\* cited by examiner

*Primary Examiner* — Victor A Mandala
*Assistant Examiner* — Colleen E Snow
(74) *Attorney, Agent, or Firm* — James L. Olsen (57) ABSTRACT

A semiconductor element includes a conductive pad. The semiconductor element further includes a first layer of a first polyimide material having an uppermost surface. The first layer includes a via trench extending through the first layer from the uppermost surface to the conductive pad. The semiconductor element further includes a second layer of a second polyimide material arranged in direct contact with the uppermost surface. The second layer includes a line trench extending to the uppermost surface. The semiconductor element further includes a conductive structure arranged in the via trench and the line trench such that copper is in direct contact with the second polyimide material.

19 Claims, 5 Drawing Sheets

RESIST PATTERNED REDISTRIBUTION WIRING ON COPPER POLYIMIDE VIA LAYER

BACKGROUND

The present disclosure relates to the electrical, electronic, and computer fields. In particular, the present disclosure relates to elements of semiconductor devices and methods of making elements of semiconductor devices.

Redistribution layers (RDLs) include interconnects that electrically connect different parts of a semiconductor package. By providing connections to different parts of a chip, an RDL can reroute or relocate connections to desired locations. For example, an RDL can be structured such that the interconnects enable redistribution of input/output (I/O) access to different parts of a semiconductor chip, thereby increasing flexibility of chip design.

SUMMARY

Embodiments of the present disclosure include a semiconductor element. The semiconductor element includes a conductive pad. The semiconductor element further includes a first layer of a first polyimide material having an uppermost surface. The first layer includes a via trench extending through the first layer from the uppermost surface to the conductive pad. The semiconductor element further includes a second layer of a second polyimide material arranged in direct contact with the uppermost surface. The second layer includes a line trench extending to the uppermost surface. The semiconductor element further includes a conductive structure arranged in the via trench and the line trench such that copper is in direct contact with the second polyimide material Additional embodiments of the present disclosure include a method of making a semiconductor element. The method includes forming a via trench in a polyimide layer such that the via trench extends through the polyimide layer from an uppermost surface of the polyimide layer to a conductive pad arranged beneath the polyimide layer. The method further includes forming a resist layer above the uppermost surface of the polyimide layer. The method further includes patterning the resist layer to form a resist trench defined by resist sidewalls. The method further includes metallizing the via trench to form a via and the resist trench to form a line having line sidewalls in direct contact with the resist sidewalls. The method further includes removing the patterned resist layer such that the line sidewalls are exposed. The method further includes forming a further polyimide layer in direct contact with the exposed line sidewalls.

Additional embodiments of the present disclosure include a method of making a semiconductor element. The method includes forming a resist layer above a polyimide layer. The method further includes patterning the resist layer to form a resist trench defined by resist sidewalls such that the resist trench extends through the resist layer to a via trench formed in the polyimide layer. The method further includes metallizing the via trench and the resist trench to form a continuous conductive structure arranged in the via trench and in the resist trench such that the conductive structure forms a line having line sidewalls in direct contact with the resist sidewalls. The method further includes removing the patterned resist layer such that the line is exposed. The method further includes forming a further polyimide layer in direct contact with the line.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

DETAILED DESCRIPTION

Aspects of the present disclosure relate generally to the electrical, electronic, and computer fields. In particular, the present disclosure relates to elements of semiconductor devices. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Turning now to an overview of technologies that are more specifically relevant to aspects of the present disclosure, in integrated circuits, interconnects, such as lines and vias, are structures that connect two or more circuit elements (such as transistors or power rails) together electrically. Lines provide electrical connection within a single layer, and vias provide electrical connection between layers in a physical electronic circuit. Redistribution layers (RDLs) include interconnects that electrically connect different parts of a semiconductor package. By providing connections to different parts of a chip, an RDL can reroute or relocate connections to desired locations. For example, an RDL can be structured such that the interconnects enable redistribution of input/output (I/O) access to different parts of a semiconductor chip, thereby increasing flexibility of chip design.

One drawback of RDLs is that they add another set of layers to the semiconductor element. An RDL requires dielectric films for electrical isolation of at least one layer of contact pads to establish electrical contact with other layers, at least one layer of metal lines, and at least one layer of vias. In fact, depending on the necessary complexity, some RDLs may add multiple layers of lines and vias. Each additional set of layers requires additional fabrication time and resources, inherently increases the size of the semiconductor element, increases overall resistivity in the chip, and introduces additional opportunities for chip failures.

Embodiments of the present disclosure may overcome these and other drawbacks of existing solutions by forming RDLs having particular geometries to provide superior electrical characteristics and superior wiring density. As discussed in further detail below, such embodiments include utilizing polyimide planarization, which reduces risks of failures introduced by the layers added by RDLs. Additionally, embodiments of the present disclosure may include utilizing dual-level metallization, which reduces the additional fabrication time and resources required for the layers added by RDLs. As discussed in further detail below, embodiments of the present disclosure also include utilizing resist patterning within the RDL, rather than patterning the polyimide. Such embodiments enable improved control over RDL geometries, thereby enabling superior electrical characteristics relative to processes in which polyimide layers in RDLs are patterned directly.

In general, the various processes used to form lines and vias for a semiconductor chip or micro-chip that will be packaged into an IC fall into three general categories, namely, deposition, removal/etching, and patterning/lithography.

Deposition is any process that grows, coats, or otherwise transfers a material onto the substrate. Available technologies include physical vapor deposition (PVD), chemical vapor deposition (CVD), electrochemical deposition (ECD), molecular beam epitaxy (MBE) and more recently, atomic layer deposition (ALD), among others. Another deposition technology is plasma enhanced chemical vapor deposition (PECVD), which is a process which uses the energy within the plasma to induce reactions at the substrate surface that would otherwise require higher temperatures associated with conventional CVD. Energetic ion bombardment during PECVD deposition can also improve the film's electrical and mechanical properties.

Removal/etching is any process that removes material from the substrate. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on substrates. With RIE the plasma is generated under low pressure (vacuum) by an electromagnetic field. High-energy ions from the RIE plasma attack the substrate surface and react with it to remove material.

Patterning/lithography is the formation of three-dimensional relief images or patterns on the semiconductor substrate for subsequent transfer of the pattern to a layer arranged beneath the pattern. In semiconductor lithography, the patterns are formed by a light sensitive polymer called a photoresist.

To build the complex structures that make up an RDL and the many wires that connect the RDL to some of the millions of transistors of a circuit, lithography and etch pattern transfer steps may each be repeated multiple times. Each pattern being printed on the substrate is aligned to previously formed patterns, and gradually the conductive and insulative regions are built up to form the final RDL.

These processes can be used in different combinations and orders within the context of two main integration schemes for forming lines and vias. A subtractive scheme refers to processes of forming line and via structures by depositing metal, and then etching the metal to form lines and vias. Alternatively, a damascene scheme refers to the processes of forming line and via structures by depositing an oxide layer, forming a trench into the oxide layer, and then depositing metal into the trench. In particular, in a typical dual damascene process (also referred to as a dual damascene flow), a structure undergoes a diffusion barrier etch step, then a via dielectric is deposited. A subsequent etch step then forms a gap in which metal is deposited to form the lines and vias simultaneously. Subtractive and damascene schemes can both be used in the formation of complex interconnect structures.

In RDLs, a variety of dielectric polymeric materials may be chosen as the insulative material for each of the layers. Typically, particularly preferred polymeric materials are polyimides, but other high temperature polymers having thermal stability, adhesion, dielectric constant, and solvent resistance properties similar to polyimides are also suitable for purposes of the present disclosure. Accordingly, for the purposes of this disclosure, the dielectric material may also be referred to as a polyimide material, although other suitable materials may also be used. Copper is typically chosen as the conductive material due to its preferred conductivity relative to other available materials. Accordingly, for the purposes of this disclosure, the conductive material may also be referred to as copper, although other suitable materials may also be used. Additionally, linings, coatings, or seeds used in conjunction with copper in conductive elements may be made of materials other than copper which are selected based on the suitability of their material properties for the requirements of their particular applications. For the purposes of this disclosure, it will be assumed that materials used for linings, coatings, or seeds include at least one material other than copper, although they may also include copper.

Figure 1:
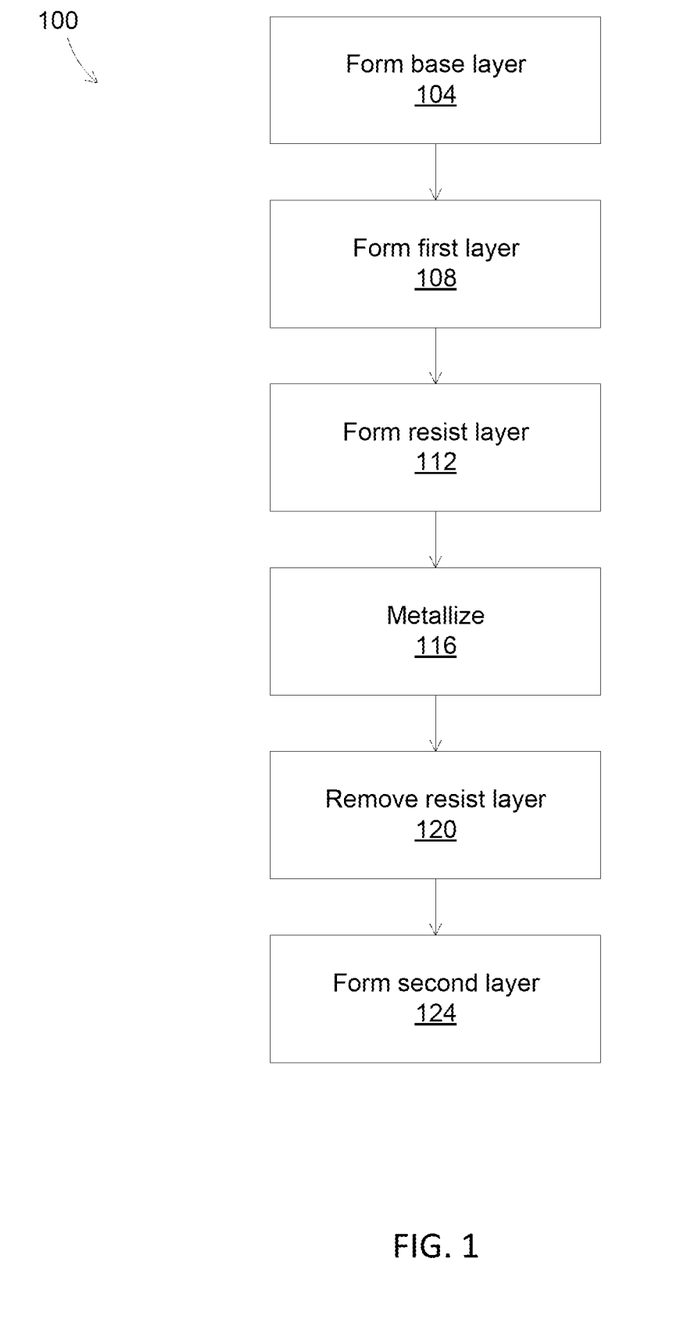
FIG. 1 illustrates a flowchart of an example method for forming a semiconductor element, in accordance with embodiments of the present disclosure.

FIG. 1 depicts a flowchart of an example method 100 for forming a semiconductor component, according to embodiments of the present disclosure. The method 100 begins with operation 104, wherein a base layer is formed. In accordance with at least one embodiment of the present disclosure, the performance of operation 104 further includes the performance of a number of sub-operations.

More specifically, in accordance with at least one embodiment of the present disclosure, the performance of operation 104 includes preparing a carrier to be used in the fabrication of an RDL. In accordance with at least one embodiment, preparing the carrier includes applying SiN on both sides of a silicon wafer and then adding a release layer to an upwardly facing side of the wafer. In particular, the SiN may be applied to the silicon wafer by, for example, CVD.

Additionally, in accordance with at least one embodiment, the performance of operation 104 also includes forming conductive pads on the release layer. In accordance with at least one embodiment, forming the conductive pads may include sputtering a thin layer of titanium followed by a thin layer of copper onto the release layer. In such embodiments, forming the conductive pads may further include applying a resist layer on top of the thin copper layer and then patterning the resist layer. In such embodiments, forming the conductive pads may further include performing a plasma ashing procedure following development of the patterned resist layer. In such embodiments, forming the conductive pads may further include performing a copper plating. The copper plating may include, for example forming a layer of nickel that is, for example, 2 micrometers thick, followed by forming a layer of copper that is, for example, 2 micrometers thick.

In such embodiments, forming the conductive pads may further include subsequently performing a resist strip to remove the resist layer followed by another plasma ashing procedure. In such embodiments, forming the conductive pads may further include performing a copper etch and titanium etch. In particular, the copper and titanium etch may be performed with end point detection to ensure control over the depth of the etch, and therefore the resulting geometry of the conductive pads. In such embodiments, the copper and titanium etch may be followed by another plasma ashing procedure. Finally, in such embodiments, forming the conductive pads may further include applying a capping layer, if required for subsequent processing. Such a capping layer may be applied, for example, by CVD, electroless plating, or an immersion coating. In such embodiments, the capping layer could be a thin metal, a dielectric, or an organic material. The resulting conductive pads may include a copper, nickel, copper structure.

In accordance with at least one embodiment of the present disclosure, the performance of operation 104 further includes forming a base dielectric layer. More specifically, the base dielectric layer is formed so as to surround the conductive pads. In accordance with at least one embodiment of the present disclosure, the base dielectric layer is made of a polyimide material. In accordance with at least one embodiment of the present disclosure, the polyimide material is a non-photosensitive polyimide material.

In accordance with at least one embodiment of the present disclosure, forming the base dielectric layer includes first applying a coating. For example, in accordance with at least one embodiment of the present disclosure, forming the base dielectric layer may include spin applying the polyimide material so as to coat the conductive pads as well as any other exposed portions of the carrier. In such embodiments, forming the base dielectric layer further includes curing the polyimide material. For example, the polyimide material can be cured at a temperature in the range of approximately 375° C. to approximately 400° C.

In accordance with at least one embodiment of the present disclosure, forming the base dielectric layer further includes planarizing the polyimide material down to an uppermost surface of the conductive pads. Accordingly, following the planarization, the uppermost surface of the base layer includes the uppermost surfaces of the conductive pads exposed within the uppermost surface of the polyimide material. The uppermost surfaces of the conductive pads and the polyimide material are substantially planar and substantially coplanar with one another. The planarization of the base layer provides a well-controlled surface on which additional layers of the RDL can be built, thereby improving the reliability of the RDL and reducing the risks of failure introduced by the additional layers of the RDL.

In accordance with at least one embodiment of the present disclosure, forming the base dielectric layer may further include applying a capping layer on the planarized uppermost surface of the base layer. In such embodiments, the capping layer may be applied by, for example, CVD.

Figure 2A:
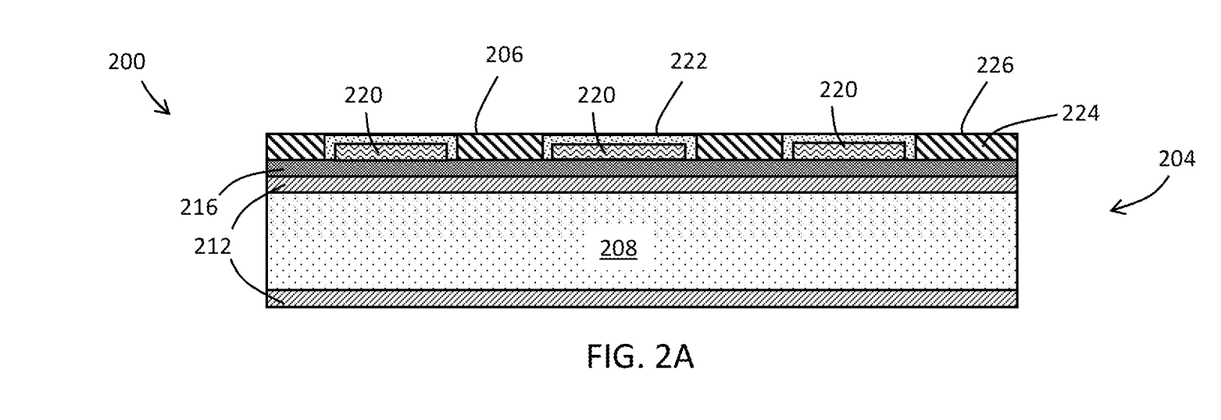
FIG. 2A illustrates an example of a semiconductor element following the performance of a portion of the example method of FIG. 1, in accordance with embodiments of the present disclosure.

FIG. 2A depicts an example structure 200 following the formation of the base layer 204 in such embodiments. Accordingly, as shown in FIG. 2A, the base layer 204 includes a wafer 208, a SiN coating 212 on both sides of the wafer 208, and a release layer 216 on the upwardly facing side of the wafer 208. The upwardly facing side refers to the orientation of the wafer 208 as depicted in FIG. 2A.

The base layer 204 further includes conductive pads 220 arranged in a base dielectric layer 224. As discussed above, in at least one embodiment of the present disclosure, the base dielectric layer 224 is made of a polyimide material. As discussed above, the base layer 204 includes an uppermost surface 206 which includes uppermost surfaces 222 of the conductive pads 220 and uppermost surfaces 226 of the base dielectric layer 224. The uppermost surfaces 222, 226 are substantially coplanar such that the uppermost surface 206 of the base layer 204 is substantially planar.

Returning to FIG. 1, following the performance of operation 104, the method 100 proceeds with the performance of operation 108 wherein a first layer is formed. In particular, the first layer includes a layer of polyimide material arranged above the base layer. In accordance with at least one embodiment of the present disclosure, the performance of operation 108 further includes the performance of a number of sub-operations.

Figure 2B:
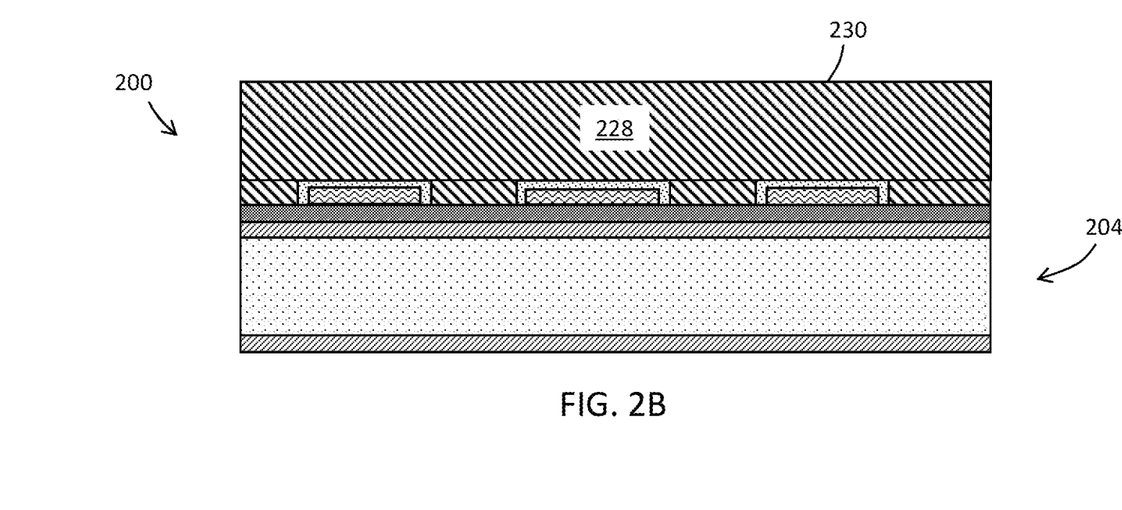
FIG. 2B illustrates an example of a semiconductor element following the performance of a portion of the example method of FIG. 1, in accordance with embodiments of the present disclosure.

More specifically, in accordance with at least one embodiment of the present disclosure, the performance of operation 108 includes applying a layer of polyimide material on top of the base layer. The layer of polyimide material can be applied by, for example, spin applying. FIG. 2B depicts the example structure 200 following the performance of this portion of operation 108. Accordingly, FIG. 2B depicts a layer of polyimide material 228 formed on top of the base layer 204. The layer of polyimide material 228 defines an uppermost surface 230 thereof.

In accordance with at least one embodiment of the present disclosure, the polyimide material is a photosensitive polyimide (PSPI) material. In such embodiments, the performance of operation 108 further includes soft baking the layer of PSPI material. In such embodiments, the performance of operation 108 further includes performing lithography and developing the PSPI material to pattern trenches in the polyimide layer. In such embodiments, the performance of operation 108 further includes curing the patterned polyimide layer. For example, the patterned polyimide layer can be cured at a temperature in the range of approximately 375° C. to approximately 400° C. In such embodiments, the performance of operation 108 further includes performing plasma ashing.

In accordance with at least one alternative embodiment of the present disclosure, the polyimide material is a non-photosensitive polyimide (non-PSPI) material. In such embodiments, the performance of operation 108 further includes curing the non-PSPI material followed by applying and patterning a resist layer on top of the cured non-PSPI material. In such embodiments, a lithography process is then performed, and the resist layer is developed. In such embodiments, RIE or laser etching is then performed to create trenches in the polyimide material. In such embodiments, the resist layer is then stripped.

Figure 2C:
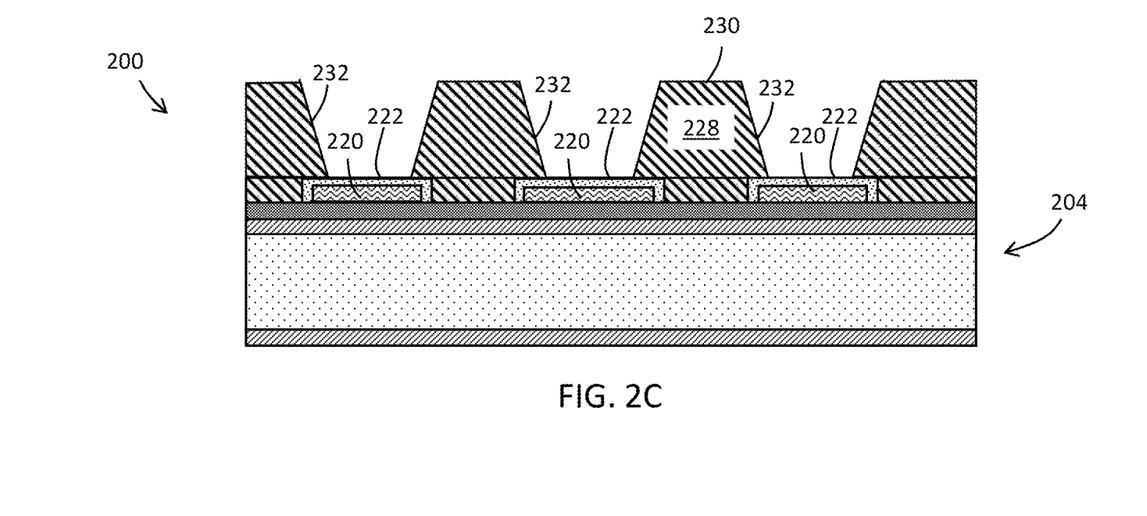
FIG. 2C illustrates an example of a semiconductor element following the performance of a portion of the example method of FIG. 1, in accordance with embodiments of the present disclosure.

Whether the performance of operation 108 is in accordance with either of the embodiments described above, FIG. 2C depicts the example structure 200 following the performance of this portion of operation 108. Accordingly, FIG. 2C depicts trenches 232 formed in the layer of polyimide material 228. The trenches 232 will later be filled with conductive material to form vias in the semiconductor element. Accordingly, the trenches 232 may also be referred to herein as via trenches. Each of the trenches 232 extends through the entirety of the layer of polyimide material 228. Accordingly, each of the trenches 232 extends from the uppermost surface 230 of the layer of polyimide material 228 to the uppermost surface 222 of a corresponding conductive pad 220. In this way, electrical contact can be established with the conductive pads 220 through the layer of polyimide material 228 by conductive material later deposited in the via trenches 232.

In accordance with at least one embodiment of the present disclosure, the performance of operation 108 further includes applying a seed layer to the layer of polyimide material. In such embodiments, the seed layer can include, for example, a thin layer of titanium followed by a thin layer of copper. In such embodiments, the seed layer can be applied, for example, by PVD seed deposition.

Figure 2D:
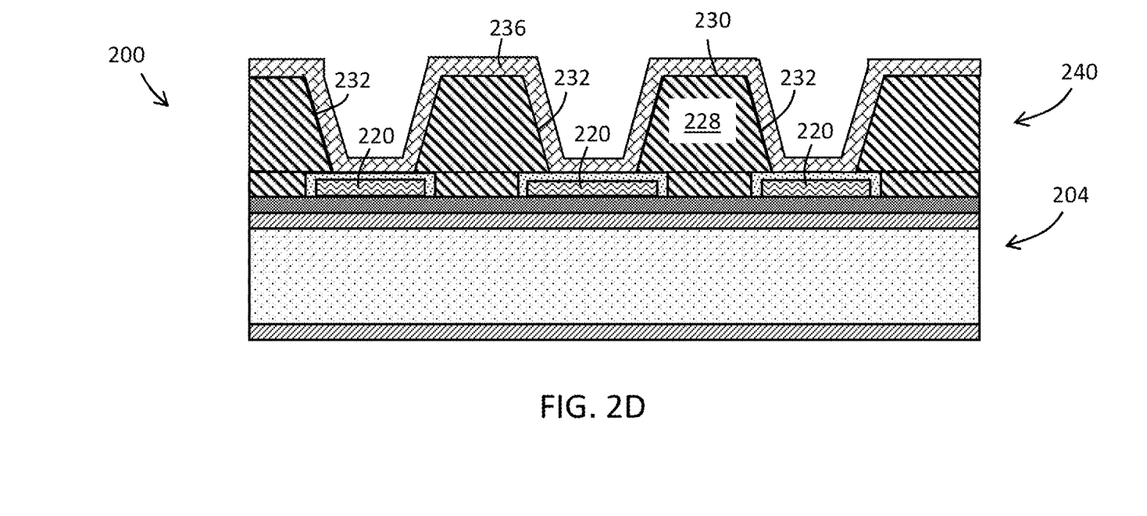
FIG. 2D illustrates an example of a semiconductor element following the performance of a portion of the example method of FIG. 1, in accordance with embodiments of the present disclosure.

FIG. 2D depicts the example structure 200 following the performance of this portion of operation 108 of the method 100. Accordingly, FIG. 2D depicts a seed layer 236 arranged on the layer of polyimide material 228. As shown, the seed layer 236 covers exposed portions of the layer of polyimide material 228 within the trenches 232 as well as remaining portions of the uppermost surface 230 of the layer of polyimide material 228. The seed layer 236 also covers portions of the uppermost surfaces of the conductive pads 220 that were exposed by the trenches 232. Accordingly, the seed layer 236 establishes electrically conductive contact with the conductive pads 220.

FIG. 2D depicts the example structure 200 following the performance of the entirety of operation 108 in accordance with the embodiments set forth above, and therefore depicts a first layer 240 arranged above the base layer 204, wherein the first layer 240 includes the layer of polyimide material 228, the via trenches 232, and the seed layer 236.

Returning to FIG. 1, following the performance of operation 108, the method 100 proceeds with the performance of operation 112 wherein a resist layer is formed. In particular, the resist layer is formed so as to be arranged above the first layer. In accordance with at least one embodiment of the present disclosure, the performance of operation 112 further includes the performance of a number of sub-operations.

More specifically, in accordance with at least one embodiment of the present disclosure, the performance of operation 112 includes applying a resist layer. The resist layer can be applied, for example, by spin applying. In such embodiments, the performance of operation 112 further includes soft baking the resist layer. In accordance with at least one embodiment of the present disclosure, the performance of operation 112 further includes performing a lithographic procedure, developing the resist layer, and performing a plasma ashing procedure. The performance of operation 112 results in a resist layer that is patterned such that some portions of the first layer are covered by the resist layer and other portions of the first layer are exposed. As described in further detail below, the patterned resist layer will provide the pattern for subsequently applied conductive material.

Figure 2E:
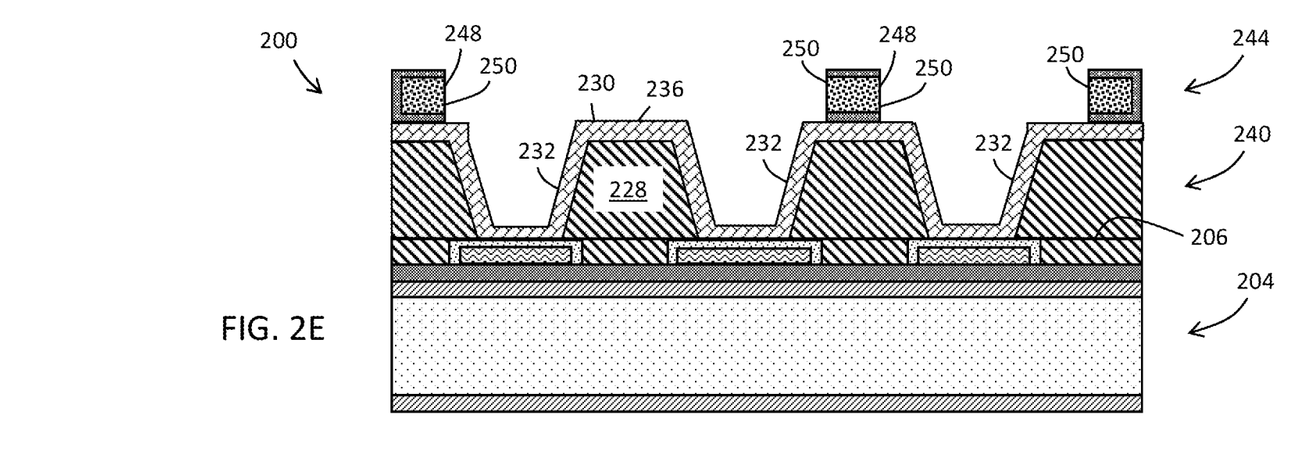
FIG. 2E illustrates an example of a semiconductor element following the performance of a portion of the example method of FIG. 1, in accordance with embodiments of the present disclosure.

FIG. 2E depicts the example structure 200 following the performance of operation 112. Accordingly, FIG. 2E includes a resist layer 244 arranged above the first layer 240. In particular, the resist layer 244 is arranged on top of the seed layer 236. As shown, the patterned resist layer 244 includes resist trenches 248 that extend through the resist layer 244 to the seed layer 236. More specifically, each resist trench 248 is defined by resist sidewalls 250 where the material of the resist layer 244 is interrupted by the resist trench 248. The resulting resist trenches 248 open to the via trenches 232 lined by the seed layer 236.

The geometry of the resist sidewalls 250 is able to be tightly controlled due to the materials and procedures used to form the resist layer 244. As a result, the resist sidewalls 250 are able to be formed substantially vertically. In other words, the resist sidewalls 250 are substantially orthogonal to the uppermost surface 230 of the layer of polyimide material 228. Additionally, because the geometry can be tightly controlled, the resist sidewalls 250 are able to be formed in relatively high density with reduced risk of resulting deformities.

As described in further detail below, the geometry of the resist trenches will define the geometry of the lines that will be subsequently formed by applying conductive material to the structure. Accordingly, the ability to tightly control the resist sidewalls provides the ability to tightly control line geometry. Improved control over line geometry enables the formation of higher density line geometries without the increased risk of failure that typically results from higher density line geometries.

Notably, the control over the geometry of the resist sidewalls 250 (and therefore over the line geometries) is limited by the consistency of the underlying layers. The flatter, or more planar, the uppermost surface 206 of the base layer 204, the more consistent the uppermost surface of the seed layer 236 on which the resist layer 244 is applied. The more consistent the uppermost surface of the seed layer 236 on which the resist layer 244 is applied, the more controllable the geometry of the resist trenches 248. Accordingly, the planarization of the uppermost surface 206 of the base layer 204 ultimately impacts and improves the line geometries of the RDL.

Returning to FIG. 1, following the performance of operation 112, the method 100 proceeds with the performance of operation 116 wherein the structure is metallized. In particular, operation 116 includes performing a dual-level metallization. In accordance with at least one embodiment of the present disclosure, the performance of operation 116 further includes the performance of a number of sub-operations.

More specifically, in accordance with at least one embodiment of the present disclosure, the performance of operation 116 includes metallizing the vias and the lines in the structure in one step. In other words, no intervening operations or processes are performed between the metallization of the vias and the metallization of the lines. As a result, connected lines and vias are formed as continuous metallized structures, and there are no interfaces or additional materials between connected lines and vias. Forming the lines and vias in a dual-level metallization process thereby improves the conductivity of the RDL. In other words, dual-level metallization reduces overall resistivity of the RDL by eliminating barriers and materials other than copper between connected lines and vias. Additionally, dual-level metallization enables increased fabrication efficiencies, thereby reducing costs and required resources.

In accordance with at least one embodiment of the present disclosure, metallizing the vias and lines can include electroplating the structure with a conductive material such that the conductive material forms conductive structures that are in direct contact with the seed layer in the via trenches and are in direct contact with the seed layer and the resist layer in the resist trenches. As noted above, the preferred conductive material is copper due to its superior conductive properties, but the same arrangement of the conductive structures applies regardless of what conductive material is used.

Notably, the conductive material is in direct contact with the resist layer at the resist sidewalls. In other words, there is no additional material or barrier at the interface of the resist sidewalls and the conductive material.

Figure 2F:
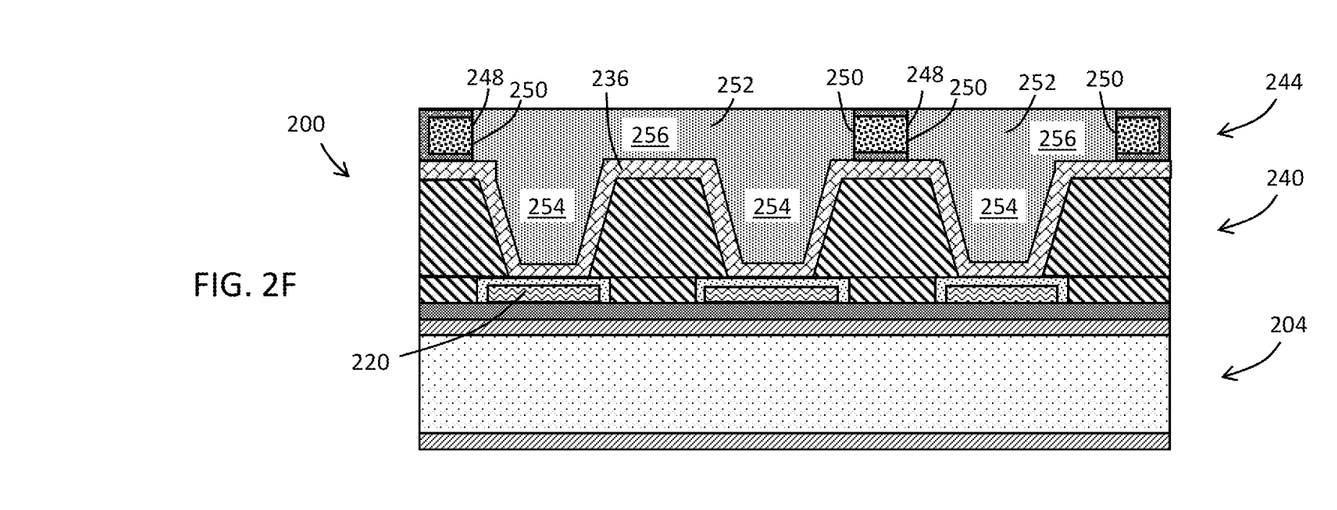
FIG. 2F illustrates an example of a semiconductor element following the performance of a portion of the example method of FIG. 1, in accordance with embodiments of the present disclosure.

FIG. 2F depicts the example structure 200 following the performance of operation 116. Accordingly, FIG. 2F depicts conductive structures 252, each of which includes at least one via 254 and at least one line 256. By way of illustrative example, the structure 200 includes three vias 254 and two lines 256 arranged such that one line 256 is connected to two vias 254 and the other line 256 is connected to the remaining via 254. Each via 254 is connected to a corresponding conductive pad 220. In other words, in the example structure 200, one conductive structure 252 is arranged in two via trenches 232 and one resist trench 248 and the other conductive structure 252 is arranged in the remaining via trench 232 and the remaining resist trench 248. However, other numbers and arrangements of lines and vias are made possible by the same processes by simply patterning the layers differently.

As shown, connected vias 254 and lines 256 are integrally formed with one another such that no barrier or interface exists between them. The vias 254 are formed where conductive material filled the via trenches 232, and the lines 256 are formed where conductive material filled the resist trenches 248 during metallization. The vias 254 establish electrically conductive contact with the conductive pads 220 and with the lines 256, and the lines 256 establish electrically conductive contact between vias 254 and will enable electrically conductive contact with other semiconductor elements that will later be connected to the RDL.

As shown, in the vias 254, the conductive material is in direct contact with the seed layer 236. The material forming the seed layer 236 is also conductive, but not as conductive as the conductive material used to form the conductive structures 252. In the lines 256, the conductive material is in direct contact with the material forming the resist layer 244 at the resist sidewalls 250 of the resist trenches 248 and is in direct contact with the material forming the seed layer 236 at the bottoms of each of the resist trenches 248 where the resist sidewalls 250 intersect with the uppermost surface of the seed layer 236.

Utilizing the resist layer 244 to provide the pattern for subsequently applied conductive material, rather than patterning the layer of polyimide material that will serve as the dielectric material insulating the lines 256, enables much greater control over the resulting geometries of the conductive structures 252. Accordingly, utilizing the resist layer 244 in the performance of operation 112 of the method 100 enables an increase in the fineness of trenches for line spacing, which enables superior wiring density for chip-to-chip connections provided by the RDL.

Additionally, the greater control enabled by utilizing the resist layer 244 allows for straighter sidewalls of the lines 256 in the RDL. This also enables superior wiring density for chip-to-chip connections. Additionally, utilizing a resist layer 244 to provide the pattern for the conductive material also removes the need for a seed layer along the sidewalls of the line 256. Accordingly, the interfaces between the lines 256 and the subsequently applied polyimide material that will serve as the dielectric material insulating the lines 256 will not include any material having higher resistivity than copper, thereby enabling the RDL to exhibit superior electrical characteristics. Additionally, because the pattern for the conductive material is provided by the resist layer 244, the line 256 and the via 254 are able to be formed at the same time in a dual-level metallization procedure. As noted above, a line and via that are formed at the same time will not include any barrier or interface between them, which also enables the RDL to exhibit superior electrical characteristics.

Returning to FIG. 1, following the performance of operation 116, the method 100 proceeds with the performance of operation 120 wherein the resist layer is removed. In particular, operation 120 includes removing the remaining resist layer that had been patterned and provided the resist sidewalls for the performance of operation 116, wherein the structure was metallized. In accordance with at least one embodiment of the present disclosure, the performance of operation 120 further includes the performance of a number of sub-operations.

More specifically, in accordance with at least one embodiment of the present disclosure, the performance of operation 120 includes stripping the remaining portions of the resist layer once the lines have been metallized. In such embodiments, removing the remaining resist layer can further include performing plasma ashing.

In accordance with at least one embodiment of the present disclosure, removing the resist layer can further include performing a seed etch to remove portions of the seed layer that remain between the metallized lines and have been exposed by the removal of the remaining portions of the resist layer. Following the performance of this portion of operation 120, the metallized lines extend above the uppermost surface of the layer of polyimide material.

Figure 2G:
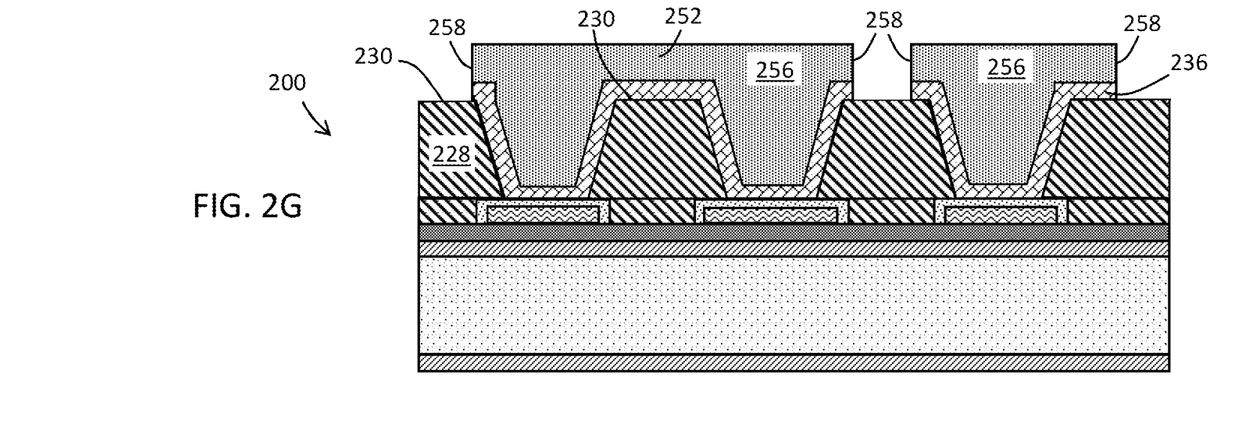
FIG. 2G illustrates an example of a semiconductor element following the performance of a portion of the example method of FIG. 1, in accordance with embodiments of the present disclosure.

FIG. 2G depicts the example structure 200 following the performance of operation 120 of the method 100. As shown, the resist layer 244 (shown in FIG. 2F) has been entirely removed. Additionally, portions of the seed layer 236 between the metallized lines 256 have also been removed to prevent shorting between adjacent lines 256. Accordingly, the uppermost surface 230 of the layer of polyimide material 228 is exposed between the metallized lines 256.

As shown in FIG. 2G, the sidewalls 258 of the lines 256 are substantially planar and are substantially orthogonal to the uppermost surface 230 of the layer of polyimide material 228. This line geometry was made possible by the use of the resist layer 244 (shown in FIG. 2F) for the formation of the lines 256. Forming the conductive material 252 of the lines 256 in direct contact with the resist sidewalls 250 (shown in FIG. 2F) enabled the sidewalls 258 of the lines 256 to be formed with the same geometric control as the resist trenches 248 (shown in FIG. 2F).

In accordance with an alternative embodiment of the present disclosure, the performance of operation 120 may further include applying a cap to the exposed lines to protect the copper of the lines during subsequent fabrication processes. Whether such a cap is included is dependent upon the subsequent fabrication processes that may be performed, and the materials used therein, to prepare the RDL for a particular application. In such embodiments, the cap is made of a material having a resistance that is inherently higher than copper, but that is less than that which would be produced by a seed layer including, for example, a titanium layer. Non-limiting examples of the material that could be used for such a cap include a nitride or cobalt. As mentioned above, the materials used for such a cap depend on subsequent fabrication processes and the application of the RDL.

Returning to FIG. 1, following the performance of operation 120, the method 100 proceeds with the performance of operation 124 wherein a second layer is formed. In particular, the performance of operation 124 includes forming a second layer of polyimide material on the structure. In accordance with at least one embodiment of the present disclosure, the performance of operation 124 further includes the performance of a number of sub-operations.

More specifically, in accordance with at least one embodiment of the present disclosure, the performance of operation 124 includes applying a second layer of polyimide material on top of the lines and on top of the exposed portions of the first layer of polyimide material. In accordance with at least one embodiment of the present disclosure, the second layer can be applying by spin applying. In accordance with at least one embodiment of the present disclosure, the polyimide material of the second layer is a non-PSPI material. In an alternative embodiment, the polyimide material may be a PSPI material. In accordance with at least one embodiment of the present disclosure, the polyimide material of the second layer is different than the polyimide material used for the first layer. In an alternative embodiment, the polyimide material of the second layer may be the same as the polyimide material of the first layer.

The polyimide material of the second layer is in direct contact with the sidewalls of the lines, with portions of the seed layer that are exposed between the lines and the uppermost surface of the first layer of polyimide material, and with exposed portions of the uppermost surface of the first layer of polyimide material. Where the polyimide material of the second layer is in direct contact with the sidewalls of the lines, no material is arranged between the copper of the line and the polyimide material of the second layer. Accordingly, no increase in resistivity is generated at the interface of the copper line and the polyimide material of the second layer.

In accordance with at least one embodiment of the present disclosure, the performance of operation 124 further includes planarizing the second layer of polyimide material down to the uppermost surface of the lines. In other words, the second layer of polyimide material is planarized so as to expose the uppermost surfaces of the lines.

Figure 2H:
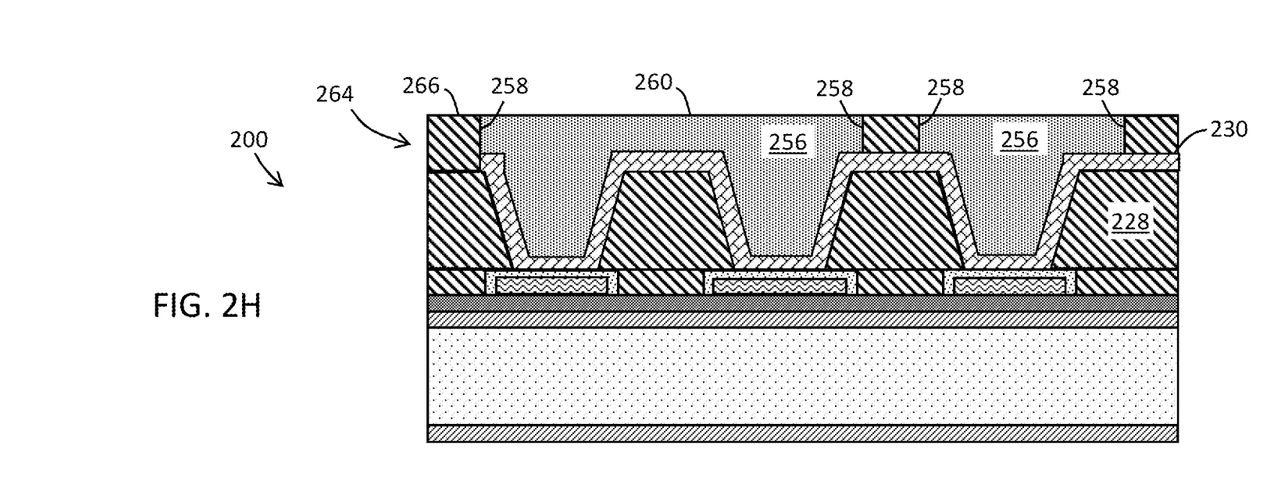
FIG. 2H illustrates an example of a semiconductor element following the performance of a portion of the example method of FIG. 1, in accordance with embodiments of the present disclosure.

FIG. 2H depicts the structure 200 following the performance of operation 124. As shown, the second layer of polyimide material 264 is in direct contact with the sidewalls 258 of the lines 256. Accordingly, the interfaces where the copper of the lines 256 are in direct contact with the second layer of polyimide material 264 are substantially planar and are substantially orthogonal to the uppermost surface 230 of the first layer of polyimide material 228. The second layer of polyimide material 264 is also in direct contact with the uppermost surface 230 of the first layer of polyimide material 228. Additionally, the second layer of polyimide material 264 is planarized down to exposed uppermost surfaces 260 of the lines 256. Accordingly, uppermost surfaces 266 of the second layer of polyimide material 264 are substantially planar and are substantially coplanar with the uppermost surfaces 260 of the lines 256.

In accordance with at least one embodiment of the present disclosure, following the planarization of operation 124, additional layers can be built in the RDL. In such embodiments, the additional layers are built in the same manner described above. In particular, the method 100 may proceed by returning to operation 108 and forming a further first layer. In such embodiments, the further first layer will be formed on top of the second layer of polyimide material rather than on top of the base layer.

In such embodiments, the method 100 may then proceed by repeating the performance of operations 112-124 to form further vias and further lines in substantially the same manner as the vias and lines described above. In the same way that the control over the geometry of the lines was dependent upon the planarization of the uppermost surface of the base layer, control over the geometry of further lines is dependent upon the planarization of the uppermost surface of the second layer.

In accordance with at least one embodiment of the present disclosure, the performance of operations 108-124 can be repeated in this manner until the desired number of levels of the RDL have been fabricated. Once the desired number of levels of the RDL have been fabricated, the RDL can be finalized. For example, under bump metallurgy (UBM) and controlled collapse chip connections (C4s) can be added to the structure, the base layer can be separated from the first layer at the release layer, and the resulting RDL component can be assembled with other elements of the semiconductor.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A semiconductor element, comprising:
    a conductive pad;
    a first layer of a first polyimide material having an uppermost surface, the first layer including a via trench extending through the first layer from the uppermost surface to the conductive pad;
    a second layer of a second polyimide material arranged in direct contact with the uppermost surface, the second layer including a line trench extending to the uppermost surface; and
    a conductive structure arranged in the via trench and the line trench, wherein a sidewall of a line of the conductive structure arranged in the line trench includes a cap that is in direct contact with the second polyimide material.

2. The semiconductor element of claim 1, wherein the conductive structure includes copper that extends continuously and uninterruptedly from the via trench to the line trench.

3. The semiconductor element of claim 1, wherein the first polyimide material is a photosensitive polyimide material.

4. The semiconductor element of claim 1, wherein the second polyimide material is a non-photosensitive polyimide material.

5. The semiconductor element of claim 1, further comprising:
a further conductive pad; and
a further via trench in the first layer extending through the first layer from the uppermost surface to the further conductive pad, wherein:
the conductive structure is also arranged in the further via trench.

6. The semiconductor element of claim 1, wherein:
the sidewall is substantially planar.

7. The semiconductor element of claim 6, wherein the sidewall is substantially orthogonal to the uppermost surface.

8. A method of making a semiconductor element, the method comprising:
forming a via trench in a polyimide layer such that the via trench extends through the polyimide layer from an uppermost surface of the polyimide layer to a conductive pad arranged beneath the polyimide layer;
forming a resist layer above the uppermost surface of the polyimide layer;
patterning the resist layer to form a resist trench defined by resist sidewalls;
metallizing the via trench to form a via and the resist trench to form a line having line sidewalls in direct contact with the resist sidewalls;
removing the patterned resist layer such that the line sidewalls are exposed;
forming a cap to cover the exposed line sidewalls; and
forming a further polyimide layer in direct contact with the cap.

9. The method of claim 8, wherein the via trench and the resist trench are metallized without performing any intervening operations.

10. The method of claim 8, wherein forming the resist layer includes spin applying the resist.

11. The method of claim 8, further comprising:
prior to forming the via trench:
forming the conductive pad in a base layer of polyimide material;
planarizing the base layer to an uppermost surface of the conductive pad such that the base layer and the conductive pad form a planarized surface; and
forming the polyimide layer on the planarized surface.

12. The method of claim 8, wherein patterning the resist layer includes forming the resist trench such that the resist sidewalls are substantially orthogonal to the uppermost surface of the polyimide layer.

13. The method of claim 8, further comprising:
depositing a seed layer on the polyimide layer prior to forming the resist layer.

14. The method of claim 8, further comprising:
planarizing the further polyimide layer to an uppermost surface of the line such that the further polyimide layer and the line form a planarized surface.

15. The method of claim 14, further comprising:
forming a second polyimide layer on the planarized surface;
forming a second via trench in the second polyimide layer such that second via trench extends through the second polyimide layer from an uppermost surface of the second polyimide layer to the uppermost surface of the line;
forming a second resist layer above the uppermost surface of the second polyimide layer;
patterning the second resist layer to form a second resist trench defined by second resist sidewalls;
metallizing the second via trench to form a second via and the second resist trench to form a second line having second line sidewalls in direct contact with the second resist sidewalls;
removing the patterned second resist layer such that the second line sidewalls are exposed; and
forming a second further polyimide layer in direct contact with the exposed second line sidewalls.

16. The method of claim 15, wherein the second via trench and the second resist trench are metallized without performing any intervening operations.

17. A method of making a semiconductor element, the method comprising:
forming a resist layer above a polyimide layer;
patterning the resist layer to form a resist trench defined by resist sidewalls such that the resist trench extends through the resist layer to a via trench formed in the polyimide layer;
metallizing the via trench and the resist trench to form a continuous conductive structure arranged in the via trench and in the resist trench such that the conductive structure forms a line having line sidewalls in direct contact with the resist sidewalls;
removing the patterned resist layer such that the line sidewalls are exposed;
forming a cap to cover the exposed line sidewalls; and
forming a further polyimide layer in direct contact with the cap.

18. The method of claim 17, wherein the via trench and the resist trench are metallized without performing any intervening operations.

19. The method of claim 17, further comprising:
prior to forming the resist layer:
forming a conductive pad in a base layer of polyimide material;
planarizing the base layer to an uppermost surface of the conductive pad such that the base layer and the conductive pad form a planarized surface; and
forming the polyimide layer on the planarized surface.

* * * * *